(12) United States Patent
Schulz

(10) Patent No.: US 8,507,347 B2
(45) Date of Patent: Aug. 13, 2013

(54) SEMICONDUCTOR DEVICES AND METHODS OF MANUFACTURE THEREOF

(75) Inventor: Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/355,610

(22) Filed: Jan. 23, 2012

(65) Prior Publication Data

US 2012/0119297 A1   May 17, 2012

Related U.S. Application Data

(62) Division of application No. 11/810,858, filed on Jun. 7, 2007, now Pat. No. 8,124,483.

(51) Int. Cl.
*H01L 21/336* (2006.01)

(52) U.S. Cl.
USPC ............................................. 438/283

(58) Field of Classification Search
USPC ............................... 438/283, 682
See application file for complete search history.

(56) References Cited

U.S. PATENT DOCUMENTS

| | | |
|---|---|---|
| 2001/0016417 A1 | 8/2001 | Thakur et al. |
| 2006/0263961 A1* | 11/2006 | Kittl et al. ............... 438/199 |
| 2006/0286802 A1 | 12/2006 | Yu et al. |
| 2007/0007594 A1 | 1/2007 | Saito |
| 2007/0075351 A1* | 4/2007 | Schulz et al. ............... 257/314 |
| 2007/0111448 A1 | 5/2007 | Li et al. |
| 2007/0120154 A1 | 5/2007 | Zhu et al. |

OTHER PUBLICATIONS

Anil, K.G., et al., "CMP-less Integration of Fully Ni-Silicided Metal Gates in FinFETs by Simultaneous Silicidation of the Source, Drain, and the Gate Using a Novel Dual Hard Mask Approach," 2005 Symposium on VLSI Technology Digest of Technical Papers, 2005, pp. 198-199, Kyoto, Japan.

Hoffman, T., et al., "Ni-Based FUSI Gates: CMOS Integration for 45nm Node and Beyond," 1-4244-0439-8/06, 2006, 4 pp., IEEE, Los Alamitos, CA.

Kedzierski, J., et al., "Issues in NiSi-Gated FDSOI Device Integration," 0-7803-7463-3/03, 2003, 4 pp., IEEE, Los Alamitos, CA.

Kedzierski, J., et al., "Metal-Gate FinFET and Fully-Depleted SOI Devices Using Total Gate Silicidation," 0-7803-7463-X/02, 2002, 4 pp., IEEE, Los Alamitos, CA.

Kittl, J.A., et al., "Scalability of Ni FUSI Gate Processes: Phase and Vt Control to 30nm Gate Lengths," 2005 Symposium on VLSI Technology Digest of Technical Papers, 2005, pp. 72-73, Kyoto, Japan.

(Continued)

*Primary Examiner* — Bradley K Smith
(74) *Attorney, Agent, or Firm* — Slater & Matsil, L.L.P.

(57) ABSTRACT

Semiconductor devices and methods of manufacture thereof are disclosed. In a preferred embodiment, a method of manufacturing a semiconductor device includes forming a transistor, the transistor including a fin having a first side and a second side opposite the first side. The transistor includes a first gate electrode disposed on the first side of the fin and a second gate electrode disposed on the second side of the fin. The method includes forming a silicide or germanide of a metal on the first gate electrode and the second gate electrode of the transistor. The amount of the metal of the silicide or germanide is substantially homogeneous over the first gate electrode and the second gate electrode proximate the fin.

22 Claims, 6 Drawing Sheets

(56) References Cited

OTHER PUBLICATIONS

Kubicek, S., et al., "A Novel CMP-Less Integration Scheme for Dual Work Function Ni-FUSI CMOS," 1-4244-0439-8/06, 2006, 4 pp., IEEE, Los Alamitos, CA.

Lauwers, A., et al., "CMOS Integration of Dual Work Function Phase Controlled Ni FUSI with Simultaneous Silicidation of NMOS (NiSi) and PMOS (Ni-rich Silicide) Gates on HfSiON," 0-7803-9269-8/05, 2005, 4 pp., IEEE, Los Alamitos, CA.

Veloso, A., et al., "Dual Work Function Phase Controlled Ni-FUSI CMOS (NiSi NMOS, $Ni_2Si$ or $Ni_{31}Si_{12}$ PMOS): Manufacturability, Reliability & Process Window Improvement by Sacrificial SiGe Cap," 2006 Symposium on VLSI Technology Digest of Technical Papers, 2006, 2 pp., IEEE, Los Alamitos, CA.

Yu, H.Y., et al., "Demonstration of Ni Fully GermanoSilicide as a pFET Gate Electrode Candidate on HfSiON," 0-7803-9269-8/05, 2005, 4 pp., IEEE, Los Alamitos, CA.

* cited by examiner

SEMICONDUCTOR DEVICES AND METHODS OF MANUFACTURE THEREOF

This is a divisional application of U.S. patent application Ser. No. 11/810,858, entitled "Semiconductor Devices and Methods of Manufacture Thereof" which was filed on Jun. 7, 2007 and is hereby incorporated herein by reference.

TECHNICAL FIELD

The present invention relates generally to semiconductor devices, and more particularly to transistors having multiple gates and methods of manufacture thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). Conventional MOSFETs have one gate electrode that controls a channel region, and are often referred to as single gate transistors. Early MOSFET processes used one type of doping to create single transistors that comprised either positive or negative channel transistors. Other more recent designs, referred to as complementary MOS (CMOS) devices, use both positive and negative channel devices, e.g., a positive channel metal oxide semiconductor (PMOS) transistor and a negative channel metal oxide semiconductor (NMOS) transistor, in complementary configurations.

Conventional bulk single-gate planar MOSFET devices are typically formed using a three-dimensional doping profile, which includes channel implantation, source and drain region implantation, lightly doped drain (LDD) extension implantation, and pocket/halo implantation processes. Scaling down bulk devices in size has limitations, because of an increase in dopant fluctuations and stronger parasitic short channel effects, due to lack of potential control in the channel region and the deep substrate. Therefore, transistors with multiple gates are under development, such as vertical multiple-gate fin field effect transistors (FinFETs) or tri-gate devices.

A double gate transistor has two parallel gates that face each other and control the same channel region. A FinFET is a vertical double gate device, wherein the channel comprises a vertical fin comprising a semiconductor material, typically formed on a silicon-on-insulator (SOI) substrate. The two gates of a FinFET are formed on opposing sidewalls of the vertical fin with an insulating material or hard mask formed on the top of the fin.

FinFETs may be used to form CMOS devices. One or more FinFETs can be used as a PMOS and/or NMOS transistor: often, two or more fins in parallel are used to form a single PMOS or NMOS transistor, for example. FinFETs can be scaled more aggressively than planar transistor structures, and show lower gate-induced drain leakage (GIDL) current than planar transistors. However, multiple gate transistors such as FinFETs are more difficult and complicated to manufacture than planar CMOS devices, and they require distinctly different materials and introduce a variety of processing challenges.

Furthermore, it is important to design CMOS devices so that a symmetric threshold voltage ($V_t$) for the NMOS and PMOS transistors of the CMOS device is achieved. However, it is difficult to find materials, device structures, and manufacturing processes that achieve a symmetric threshold voltage $V_t$ as devices are made smaller, and more particularly for advanced transistor designs having multiple gates.

Thus, what are needed in the art are improved structures and manufacturing processes for multiple gate transistors.

SUMMARY OF THE INVENTION

These and other problems are generally solved or circumvented, and technical advantages are generally achieved, by preferred embodiments of the present invention, which comprise novel structures and methods of forming gate electrodes of multiple gate transistors.

In accordance with a preferred embodiment of the present invention, a method of manufacturing a semiconductor device includes forming a transistor, the transistor including a fin having a first side and a second side opposite the first side. The transistor includes a first gate electrode disposed on the first side of the fin and a second gate electrode disposed on the second side of the fin. The method includes forming a silicide or germanide of a metal on the first gate electrode and the second gate electrode of the transistor. The amount of the metal of the silicide or germanide is substantially homogeneous over the first gate electrode and the second gate electrode proximate the fin.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures, such as capacitors or gated diodes, as examples, or other processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
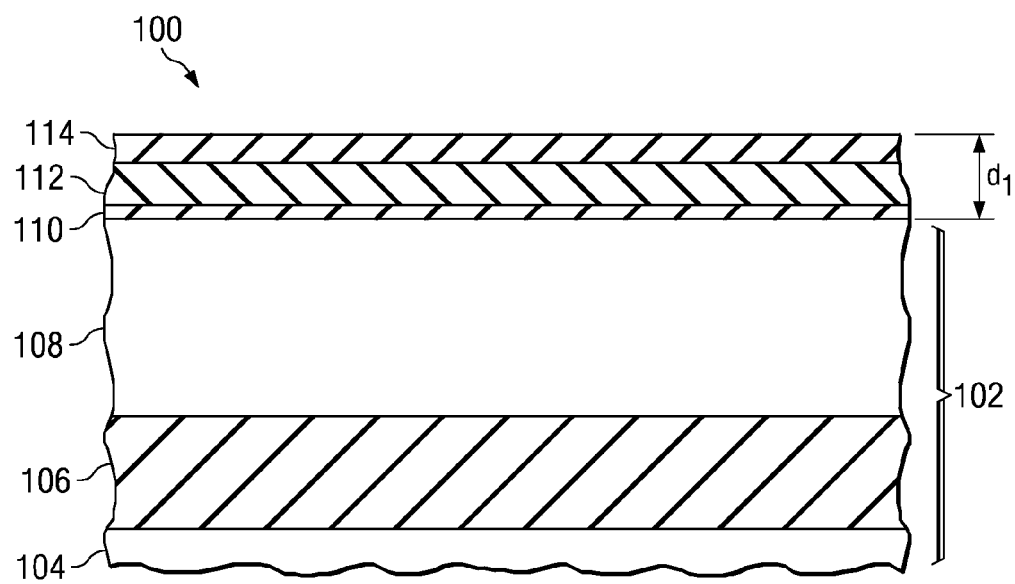
FIGS. 1 through 5 show cross-sectional views of a semiconductor device at various stages of manufacturing, illustrating a method of forming gate electrodes of a FinFET device in accordance with a preferred embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

What are needed in the art are metal gate electrode materials and methods of formation thereof that have a suitable work function for multiple gate CMOS devices. For CMOS FinFET technology to provide a maximum performance benefit over bulk-Si CMOS technology, one issue that needs to be resolved is the development of a tunable work function gate technology for threshold voltage $V_t$ control.

Because a FinFET controls the channel region by two gates disposed on both sides of a very thin fin of vertical silicon film, a FinFET device requires near mid-gap work functions rather than band-edge work functions, as in planar devices. An n channel FinFET requires a work function in a range from about 4.65 eV for low standby power applications to about 4.45 eV for high performance applications, as examples. A p channel FinFET requires a work function in a range from about 4.65 eV for low standby power applications to about 4.85 eV for high performance applications, as examples. These work functions would result in symmetrical voltage thresholds $V_{tn}$ and $V_{tp}$ (e.g., $V_{tn}$=+0.3 V and $V_{tp}$=−0.3 V, although other voltage thresholds may also be used) for the n channel and p channel devices, which is required for a CMOS device, for example.

One approach of establishing work functions and also to improve conductivity of gate electrode materials is to silicide the gate material, e.g., by depositing a metal over a polysilicon gate material, and heating the device, causing the metal to diffuse into and/or bond with the polysilicon gate material. In some applications, it is desirable to fully silicide (FUSI) the gate material, for example. However, there can be many phases of silicide that result from a silicidation process. For example, nickel silicide has six phases at low temperatures: $Ni_3Si$, $Ni_{31}Si_{12}$, $Ni_2Si$, $Ni_3Si_2$, $NiSi$, $NiSi_2$, with each phase resulting in a different work function.

Siliciding of gate electrode materials of FinFETs is difficult because of the three-dimensional structures of the vertical fins used for the channel region. The vertical fin has corners and edges, and when a polysilicon gate material is formed over the fin, the thickness of the gate material may vary over the fin. The fin structures result in a different amount of polysilicon residing on the surface at the top of the fin and at the bottom of the fin, which may react differently with the silicidation metal, such as nickel, during the silicidation process. The amount of polysilicon gate material may have different film thicknesses on horizontal services, vertical surfaces, at the edges, and at the corners of the fin, for example.

Different amounts of polysilicon gate material over the surface of the fin during the silicidation process causes different grain boundaries and different silicide phases across the surface of the fin. The different silicide phases result in different work functions at various locations around the fin. The varying work functions around the fin cause a parasitic device behavior referred to as bi-modal $V_t$, which is undesirable and should be avoided. FinFETs exhibiting this problem may have different threshold voltage $V_t$ for the sidewalls and the top of the fin, e.g., leading to $V_t$ splits within a single transistor or device, or resulting in $V_t$ splits in adjacent devices on the same die. Thus, controlling the $V_t$ during silicidation of a FinFET can be challenging, because the $V_t$ may be split into two or more "modes," depending on the silicidation process and the geometry of the structure, resulting in under-silicidation or over-silicidation of portions of the gate material over the fin.

For example, silicided edge and top, outer, corner regions of the fin may have excess metal or may be metal-rich, and silicided inner corners near the bottom of the fin may have less metal or may be metal-poor. If Ni is used as a silicidation metal, the top corners of the fin may form $Ni_2Si$, and the lower inner corners near the bottom of the fin may form $NiSi_2$, as examples. Such variations in the silicide phase may result in unpredictable or unreliable device performance, decreased device performance, and/or device failures in some applications, for example.

It is desirable to form a single stable phase of silicide over a surface of the fin when forming a partially or fully silicided (FUSI) gate on a FinFET. However, the process window to form a single stable NiSi phases is relatively small, e.g., between 5 and 20 degrees Celsius, depending on the processing options. Processing out of this process window may also lead to over-silicidation or under-silicidation of the polysilicon gate material and may lead to different phases of silicide, e.g., forming $Ni_xSi_y$, wherein x and y have varying values across the surface of the gate material.

Embodiments of the present invention achieve technical advantages by providing processing solutions that solve the problem of geometry dependent $V_t$ in FinFET devices. Several methods of solving the problem will be described, which may be used alone or in combination to improve the silicidation process and achieve a homogeneous phase of silicide over the channel region of the fin.

The present invention will be described with respect to preferred embodiments in a specific context, namely in CMOS FinFET devices. Embodiments of the present invention may also be applied, however, to other semiconductor device applications where transistors having two or more gate electrodes are utilized. The terms "gate" and "gate electrode" refer to the gate of a transistor, and these terms are used interchangeably herein.

FIGS. 1 through 5 show cross-sectional views of a semiconductor device 100 at various stages of manufacturing, illustrating a method of forming gate electrodes of a FinFET device in accordance with a preferred embodiment of the present invention. Note that in the drawings, only two FinFET devices 130 are shown; however, there may be many transistors formed on a semiconductor workpiece 102 during each of the manufacturing processes described herein.

With reference first to FIG. 1, there is shown a semiconductor device 100 in a cross-sectional view including a workpiece 102. The workpiece 102 preferably comprises a semiconductor-on-insulator substrate. The workpiece 102 may comprise a silicon-on-insulator (SOI) substrate or germanium-on-insulator (GOI) substrate, for example. The SOI substrate includes a first layer of semiconductive material 104 that comprises a substrate, a buried insulating layer 106 or buried oxide layer disposed over the first layer of semiconductive material 104, and a second layer of semiconductive material 108 disposed over the buried insulating layer 106, for example. The workpiece 102 may also include other active components or circuits formed in other regions of the workpiece 102, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may be doped with P type dopants and N type dopants, e.g., to form P wells and N wells, respectively (not shown). The second layer of semiconductor material 108 may comprise silicon (Si) having a thickness of about 100 nm, for example, although alternatively, the second layer of semiconductor material 108 may comprise other materials and dimensions. The buried insulating layer 106 may comprise a thickness of about 150 nm, for example, although the buried insulating layer 106 may alternatively comprise other dimensions.

A hard mask 110/112/114 is formed over the workpiece 102. The hard mask 110/112/114 may comprise a single layer of material or a plurality of material layers. The hard mask 110/112/114 preferably comprises an oxide layer, a nitride layer, or combinations or multiple layers thereof, for example. The hard mask 110/112/114 preferably comprises a thickness or dimension $d_1$ of greater than about 50 nm in some embodiments, for example, although alternatively, the hard mask 110/112/114 may comprise other dimensions. The thickness $d_1$ of the hard mask 110/112/114 is also referred to herein as a first thickness, for example.

In some embodiments, the hard mask 110/112/114 preferably comprises a tri-layer, as shown in FIG. 1. The hard mask 110/112/114 may comprise a first oxide layer 110 comprising about 10 nm of $SiO_2$ formed over the workpiece 102. A nitride layer 112 comprising about 20 nm of $Si_xN_y$ is formed over the first oxide layer 110. A second oxide layer 114 comprising about 20 nm of $SiO_2$ is formed over the nitride layer 112. Alternatively, the hard mask 110/112/114 may comprise other materials and dimensions, for example.

Figure 2:
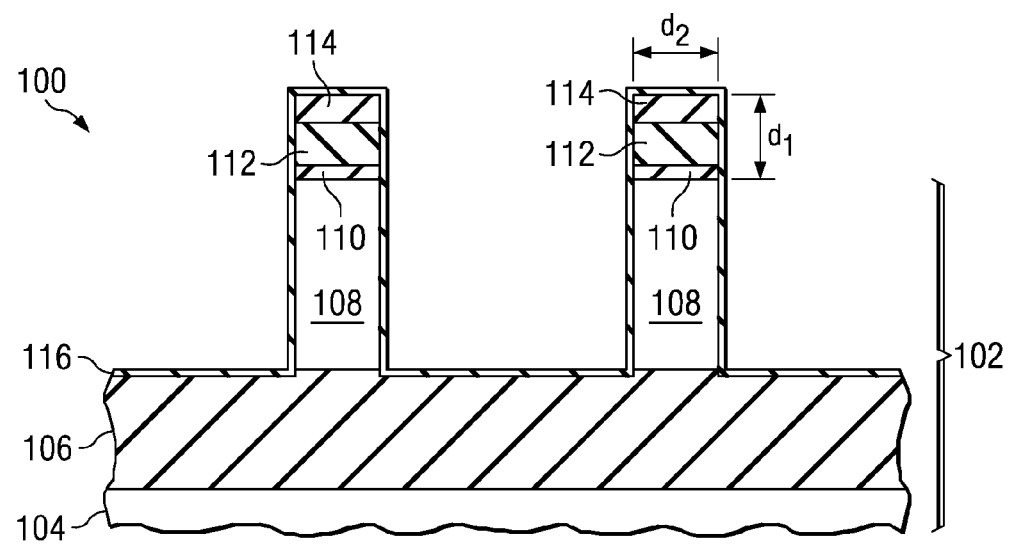

The hard mask 110/112/114 is patterned using lithography, e.g., by depositing a layer of photoresist (not shown) over the hard mask 110/112/114, exposing the layer of photoresist to energy using a lithography mask, developing the layer of photoresist, and using the layer of photoresist as a mask to pattern the hard mask 110/112/114, for example. The hard mask 110/112/114, and optionally, also the layer of photoresist are used as a mask to pattern at least the second layer of semiconductive material 108 of the workpiece 102, as shown in FIG. 2. The buried insulating layer 106 may comprise an etch stop layer for the etch process of the second layer of semiconductive material 108, for example. A top portion of the buried insulating layer 106 may be removed during the etch process of the second layer of semiconductive material 108, as shown. For example, the buried insulating layer 106 may be etched by an amount $d_1$ comprising about 15 nm or less, although alternatively, $d_1$ may comprise other dimensions.

The patterned second layer of semiconductor material 108 forms vertical fins 108 of semiconductor material extending in a vertical direction away from a horizontal surface of the workpiece 102. The fin structures 108 will function as the channels of PMOS and NMOS FinFET devices, to be described further herein. The fin structures 108 have a thickness $d_2$ that may comprise about 50 nm or less, as an example, although alternatively, the fins 108 may comprise other dimensions. For example, the thickness $d_2$ of the fin structures 108 may comprise about 5 to 60 nm, or less, in some applications. As another example, the thickness $d_2$ of the fin structures 108 may be larger, such as having a thickness $d_2$ of about 100 to 1,000 nm. The thickness $d_2$ of the fin structures 108 may vary as a function of the channel doping and other dimensions of the fin structures 108, as examples, although other parameters may also have an effect on the determination of the dimension $d_2$.

The fin structures 108 have a height equivalent to the thickness of the second layer of semiconductor material 108, for example. Only two fin structures 108 are shown in FIG. 2; however, there may be many fin structures 108, e.g., about 1 to 200 fin structures, for a PMOS or NMOS device, as examples, although alternatively, other numbers of fin structures 108 may be used.

A gate dielectric material 116 is formed over at least the sidewalls of the fins of semiconductor material 108, as shown in FIG. 2. The gate dielectric material 116 may be formed using a thermal oxidation process, for example, wherein only the semiconductor material 108 is oxidized (not shown in FIG. 2; see FIG. 7 at 216a and 216b). Alternatively, the gate dielectric material 116 may be formed using a deposition process, resulting in a thin layer of the gate dielectric material 116 also being formed on the buried insulating layer 106 and the hard mask 110/112/114 as shown in FIG. 2, for example. The gate dielectric material 116 preferably comprises a hafnium-based dielectric, $HfO_2$, $HfSiO_x$, $Al_2O_3$, $ZrO_2$, $ZrSiO_x$, $Ta_2O_5$, $La_2O_3$, $HfAlO_x$, $ZrAlO_x$, $SiAlO_x$, $HfSiAlO_x$, $ZrSiAlO_x$, $Y_2O_3$, $TiO_2$, nitrides thereof, $Si_xN_y$, $SiON$, $SiO_2$, or multiple layers or combinations thereof, as examples, although alternatively, the gate dielectric material 116 may comprise other materials.

The gate dielectric material 116 preferably comprises a high k dielectric material having a dielectric constant greater than the dielectric constant of $SiO_2$ in some embodiments. For example, the gate dielectric material 116 preferably comprises a high k dielectric material having a dielectric constant of about 4.0 or greater, for example. The gate dielectric material 116 preferably comprises a thickness of about 50 Angstroms or less in one embodiment, although alternatively, the gate dielectric material 116 may comprise other dimensions.

The gate dielectric material 116 may be formed by chemical vapor deposition (CVD), atomic layer deposition (ALD), physical vapor deposition (PVD), jet vapor deposition (JVD), an oxidation, and/or a nitridation process, as examples, although alternatively, the gate dielectric material 116 may be formed using other suitable techniques.

Figure 3:
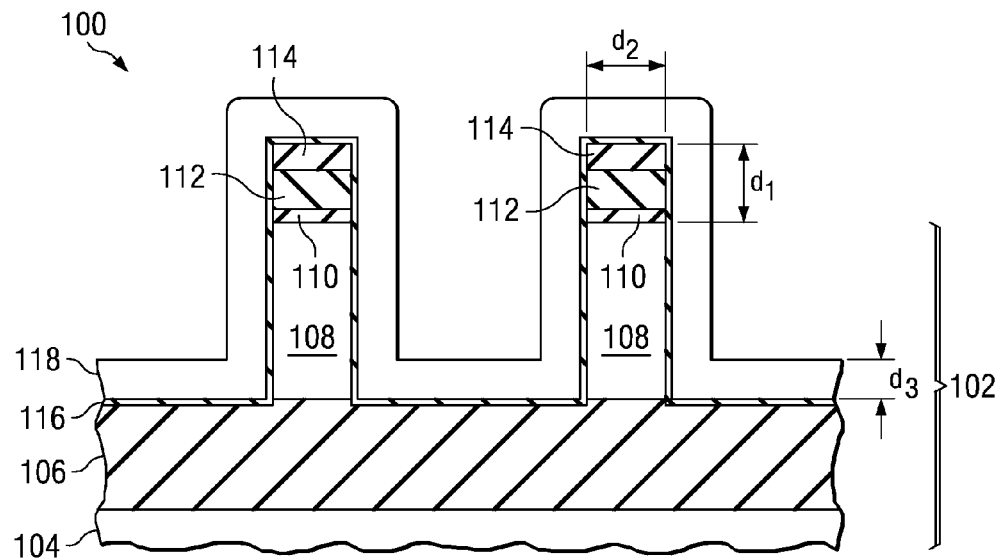

Next, a gate electrode material 118 having a thickness $d_3$ is formed over the fin structures 108, as shown in FIG. 3. The gate electrode material 118 preferably comprises a semiconductive material, for example. The gate electrode material 118 may comprise amorphous silicon, polysilicon, undoped silicon, doped silicon, or other semiconductor materials such as germanium, as an example.

In accordance with a first embodiment of the present invention, advantageously, the gate electrode material 118 is deposited having a thickness or dimension that is sufficiently thin to facilitate or improve a subsequent silicidation process. The gate electrode material 118 preferably comprises a thickness or dimension $d_3$ of about 50 nm or less, for example, although alternatively, the gate electrode material 118 may comprise other dimensions. The gate electrode material 118 preferably is thin enough to ensure that the gate electrode material 118 is fully silicided during the subsequent silicidation process in some embodiments, for example. The gate electrode material 118 is preferably deposited in a thickness that will maintain the relatively low aspect ratio of the fin 108 height-to-width; e.g., which may comprise about 3:1 or less, in some embodiments.

In some embodiments, the gate electrode material 118 is preferably thinner than the hard mask 110/112/114. For example, dimension $d_3$, the thickness of the gate electrode material 118, which is also referred to herein as a second thickness, is preferably less than the dimension $d_1$ or first thickness of the hard mask 110/112/114 in some embodiments.

The gate electrode material 118 may be deposited using CVD, ALD, PVD, or JVD, as examples, although alternatively, the gate electrode material 118 may be formed using other suitable techniques. The gate electrode material 118 comprises a first gate electrode on a first sidewall or side of a fin of semiconductor material 108. The gate electrode material 118 comprises a second gate electrode on a second sidewall or side of the fin of semiconductor material 108 opposite the first sidewall or side. Thus, a dual gate electrode structure is formed on the fins of semiconductor material 108. Again, several fins 108 may be placed in parallel to form a PMOS or NMOS FinFET device, for example.

The hard mask 110/112/114 is preferably thicker than the first gate electrode and the second gate electrode on the sides of the fin 108 in some embodiments, for example. The hard mask 110/112/114 preferably comprises a greater thickness $d_1$ than the thickness $d_3$ of the first gate electrode and the second gate electrode, for example.

Figure 4:
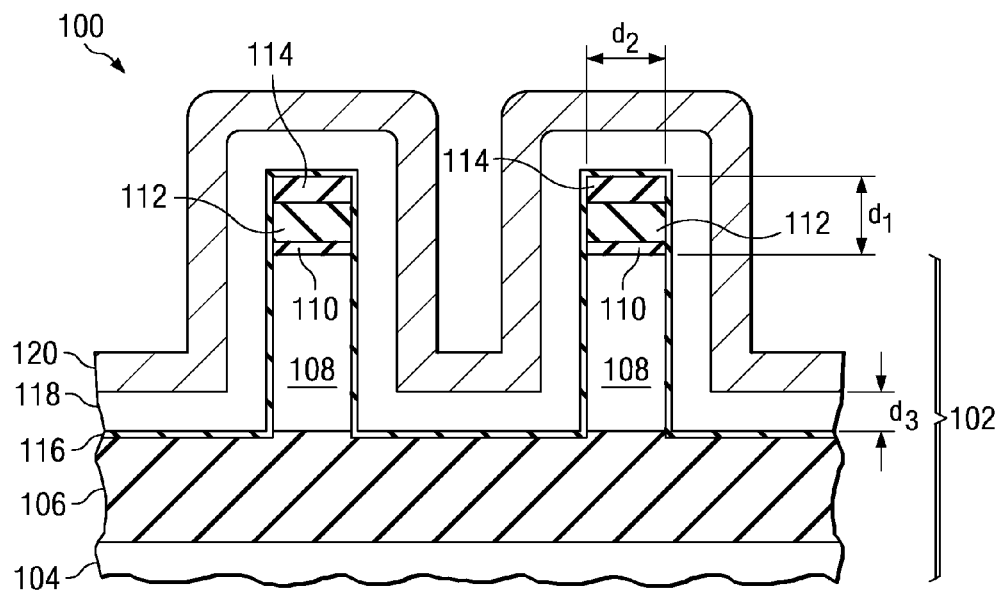

Next, the gate electrode material 118 is silicided or germanided. To silicide or germanide the gate electrode material 118, a metal layer 120 is formed over the gate electrode material 118, as shown in FIG. 4 in a cross-sectional view. The metal layer 120 may be formed using PVD, e.g., by sputtering on the metal, although alternatively, other deposition methods may be used. The workpiece 102 is then heated or annealed, e.g., using a rapid thermal anneal (RTP) or other heat process, causing the atoms of the metal layer 120 to move downward into the gate electrode material 118 toward the gate dielectric material 116 and combine or chemically react with atoms of the gate electrode material 118. The metal layer 120 preferably comprises Ni, Co, Ti, Pt, a rare earth element such as Yb, Eu, La, Ce, Pr, Pm, Nd, Sm, Gd, Tb, Dy, Ho, Er, Tm, Ln, other metals, or combinations thereof, as examples, although alternatively, the metal layer 120 may comprise other materials. The metal layer 120 preferably comprises a thickness of about 50 nm or less, although alternatively, the metal layer 120 may comprise other dimensions.

Figure 5:
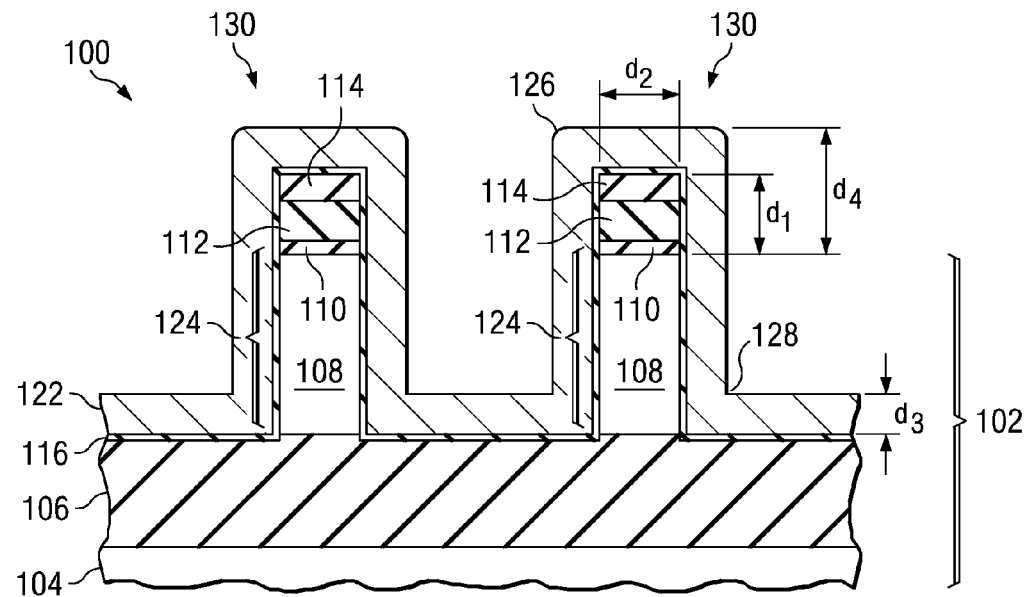

The deposition process and the temperature, duration, and other parameters of the anneal process are preferably selected to achieve a desired phase of silicide or germanide, for example. The metal layer 120 is then removed, leaving behind gate electrode material 122 that is silicided or germanided, as shown in FIG. 5. If the metal layer 120 comprises Ni, the silicided or germanided gate electrode material 122 preferably comprises NiSi or $Ni_3Si_2$ in some embodiments, for example, although other phases of $Ni_xSi_y$ and other silicides or germanides may also be formed.

The gate electrode material 118 and the silicidation or germanidation process are preferably selected to optimize the homogeneity of the phase of the silicide or germanide 122 in some embodiments of the present invention, for example. The phase of the silicide or germanide 122 formation may vary according to processing conditions, such as anneal conditions, time, temperature, and other parameters, for example.

Either before or after the silicidation process, the gate electrode material 118 or silicided or germanided gate electrode material 122 may be implanted with a dopant species, in some embodiments. The dopant species may comprise As, P, Sb, B, C, Ge, a rare earth element such as Yb, Eu, La, Ce, Pr, Pm, Nd, Sm, Gd, Tb, Dy, Ho, Er, Tm, Ln, or combinations thereof, although other elements may also be implanted into the gate electrode material 118 or 122. If the metal layer 120 comprises Ni, for example, the silicided gate electrode material 122 may comprise NiSi or $Ni_3Si_2$ doped with P or B in some embodiments, although other phases of $Ni_xSi_y$ and other dopant species may also be used.

Figure 8:
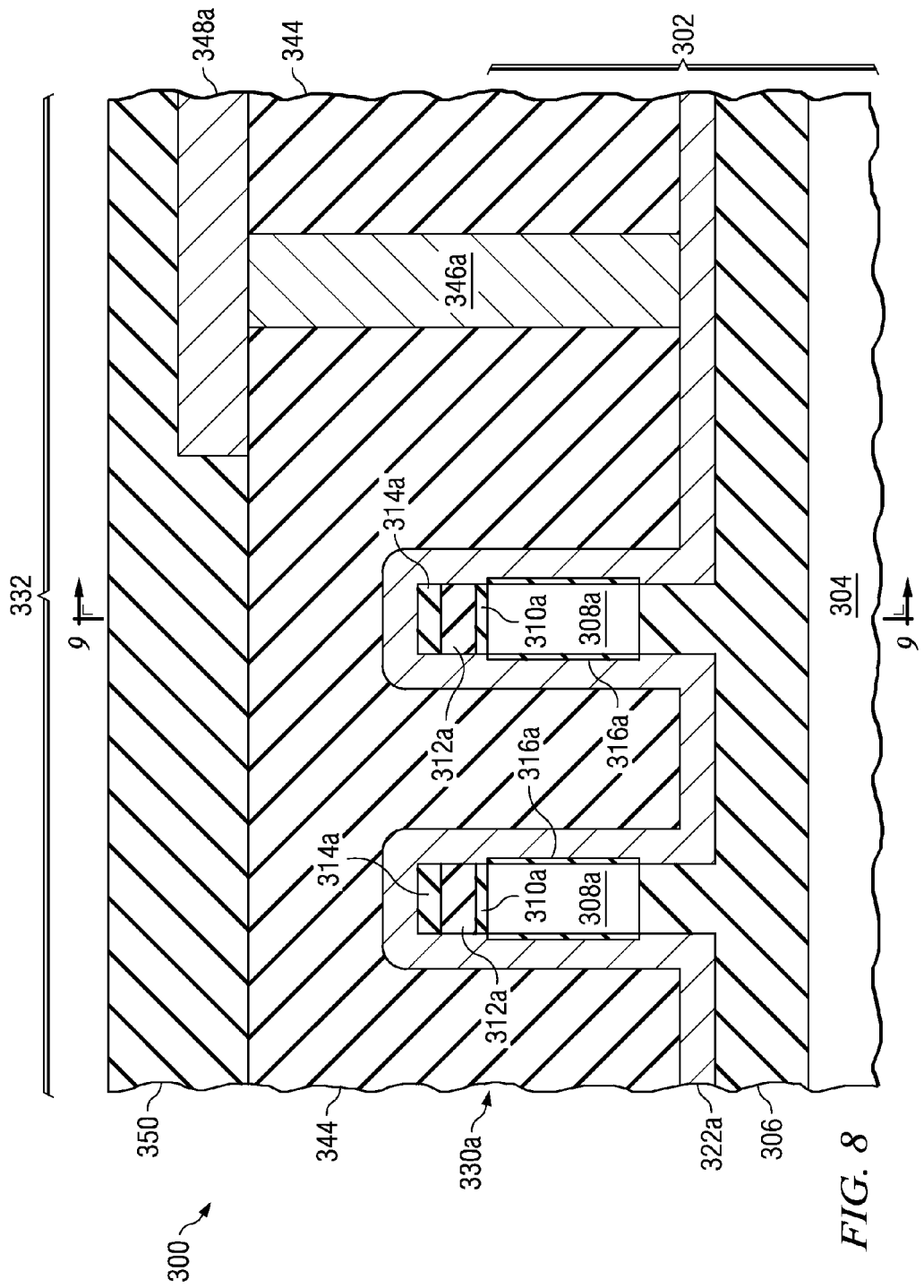
FIG. 8 shows a cross-sectional view of a FinFET device in accordance with an embodiment of the present invention after the formation of upper metallization and insulating layers over the FinFET device.
Figure 9:
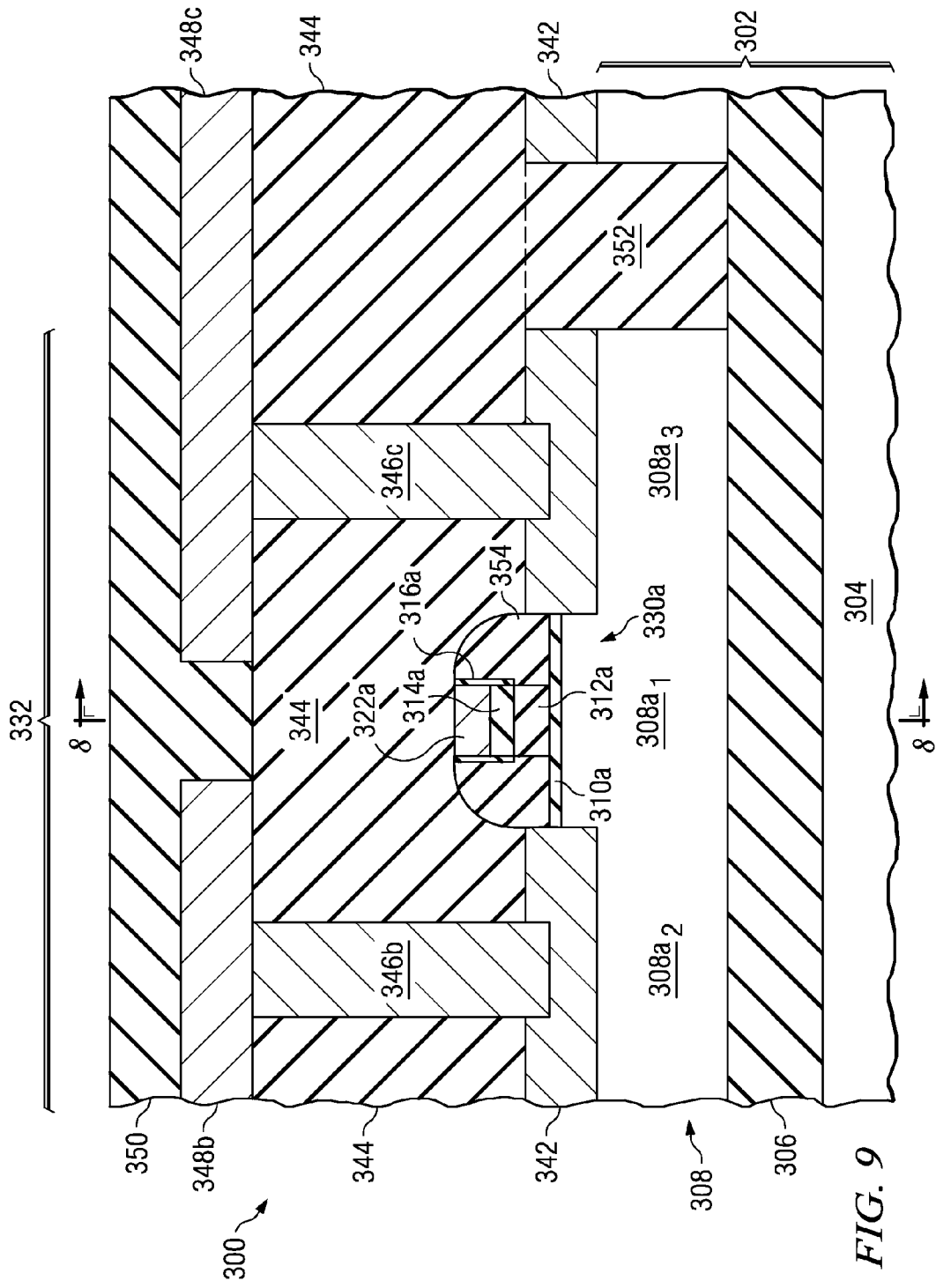
FIG. 9 shows a fin structure of the FinFET device shown in FIG. 8 in a view perpendicular to the view shown in FIG. 8.

The manufacturing process for the semiconductor device 100 is then continued. For example, portions of the gate electrode material 122 may be removed to form the gate electrodes for the CMOS FinFETs, e.g., the gate electrode material 122 and optional semiconductor material 124 are simultaneously patterned to form the gate electrodes of the FinFET devices, respectively. In some embodiments, the gate electrode material 122 is preferably patterned before the deposition of the metal layer 120, for example. Additional insulating material layers may be formed over the gate electrodes. Contacts may be made to the source, drain, and gate electrodes of the FinFETs, for example, as shown in FIGS. 8 and 9 (to be described further herein).

Advantageously, FinFET devices 130 are formed that have an amount of the metal of the silicide or germanide, e.g., the silicided or germanided gate electrode material 122, that is substantially homogeneous over the first gate electrode 122 and the second gate electrode 122 proximate the fins 108. The first gate electrode and a second gate electrode advantageously comprise a substantially homogeneous phase of silicide or germanide over the entire fin 108 height, represented by region 124 in FIG. 5, of the fins 108. An amount of doping of the first and second gate electrodes 122, a selection of the gate dielectric material 116, and/or the phase of the silicided or germanided gate electrode material 122 may be selected and chosen to establish a desired, predetermined value of the work function of the FinFET devices 130, in accordance with embodiments of the present invention, thus establishing the desired threshold voltage $V_t$ of the FinFET devices 130, for example.

For example, to achieve a silicide having a phase of NiSi, the temperature of the anneal process during silicidation is preferably relatively low, e.g., comprising a temperature of about 450 degrees C. To achieve a silicide having a phase of $Ni_3Si_2$, the temperature of the anneal process during silicidation is preferably relatively higher, e.g., comprising a temperature of about 520 degrees C. Alternatively, other temperatures may be used for the anneal process, for example.

Because in some embodiments, the gate electrode material 118/122 is thin, the silicidation process is improved, resulting in a fully silicided or germanided gate electrode material 122 and increasing the likelihood that a homogenous phase of the silicide or germanide will form over the entire length of the gate electrode material proximate the fin 108, e.g., the channel region, along the entire height of region 124.

In other embodiments, because the hard mask 110/112/114 is thicker than the gate electrode material 118/122, the top corners and edges 126 of the gate electrode material 118/122 are raised upwardly away from the workpiece 102, e.g., by an amount or dimension $d_4$, as shown in FIG. 5. Dimension $d_4$ is substantially equal to the thickness $d_1$ of the hard mask 110/112/114 and the thickness $d_3$ of the gate electrode material 118/122, for example. Thus, if any inhomogeneities are formed in the phase of the silicided or germanided gate electrode material 122 at the top corner and edges 126, the phase inhomogeneities (e.g., such as metal-rich phases of the silicide or germanide) are positioned farther away from the fins 108 comprising the channel region, and thus, the phase inhomogeneities will not deleteriously affect device 130 performance, advantageously.

Figure 6:
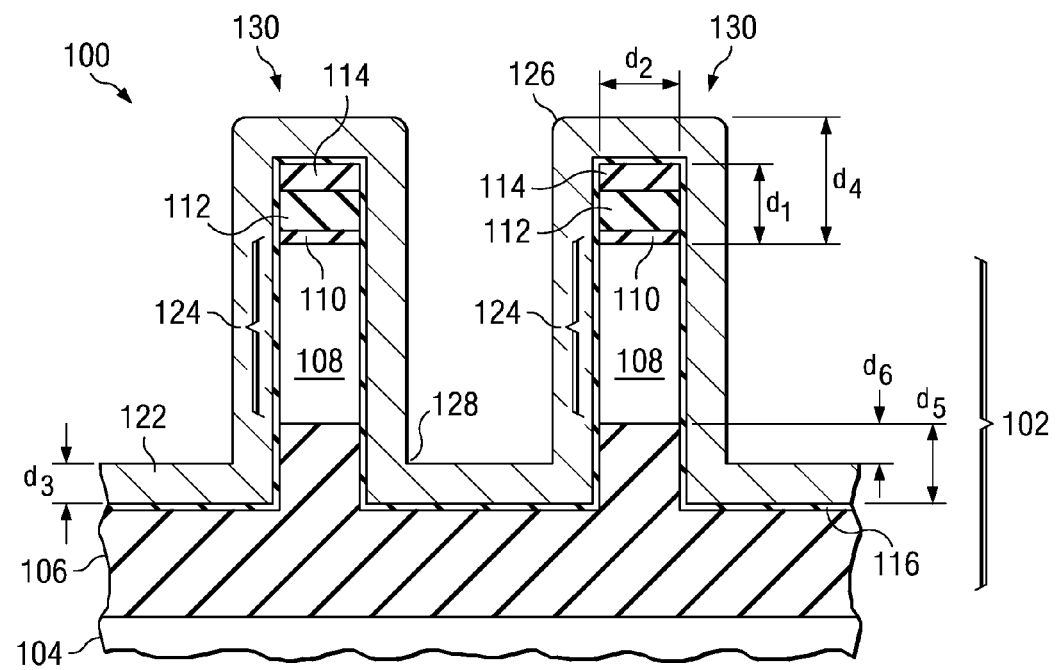
FIG. 6 shows a cross-sectional view of a method of forming gate electrodes of a FinFET device in accordance with another embodiment of the present invention.

FIG. 6 shows a cross-sectional view of another method of forming gate electrodes of a FinFET device 130 in accordance with another embodiment of the present invention Like numerals are used for the element numbers in FIG. 6 as were used in FIGS. 1 through 5, and similar materials and thicknesses are preferably used for the element numbers as were previously described for FIGS. 1 through 5.

In this embodiment, during the etch process to form the fins 108, the buried insulating layer 106 is preferably over-etched, as shown. The buried insulating layer 106 is preferably recessed by an amount represented by dimension $d_5$ below a bottom surface of the second semiconductor material 108 of the workpiece 102, e.g., below the bottom surface of the fins 108. The amount of the recess or dimension $d_5$ below the bottom surface of the fins 108 is preferably greater than the thickness of the gate electrode material 118/122, e.g., greater than the thickness of the first gate electrode and the second gate electrode 122 formed from the gate electrode material 122 on the sides or sidewalls of the fins 108, as shown in FIG. 6. The recess or dimension $d_5$ is preferably greater than about 50 nm in some embodiments, for example, although alternatively, the recess may comprise other dimensions.

Advantageously, if the inner corners 128 of the gate electrode material are under-silicided or germanided, forming a metal-poor silicide or germanide in the inner corners 128, the recessed buried insulating layer 106 further distances any silicide or germanide phase inhomogeneities away from the channel region, e.g., region 124 of the fins 108. Because the recess having dimension $d_5$ in the buried insulating material 106 is greater than the thickness of the gate electrode material 118/122, the inner corners 128 of the gate electrode material 118/122 are lowered downwardly away from the fins 108, e.g., by an amount or dimension $d_6$, as shown in FIG. 6. Dimension $d_6$ is substantially equal to the amount $d_5$ of the recess less the thickness $d_3$ of the gate electrode material 118/122, for example. Thus, if any inhomogeneities are formed in the phase of the silicided or germanided gate electrode material 122 at the inner corners 128, the silicide or germanide phase inhomogeneities (e.g., such as metal-poor phases of the silicide or germanide) are positioned farther away from the fins 108 comprising the channel region (e.g., region 124 that comprises the active silicon regions of the FinFET device 130), and thus, the silicide or germanide phase inhomogeneities will not deleteriously affect device 130 performance, advantageously.

Note that the embodiment shown in FIG. 6 is preferably combined with the embodiments shown in FIGS. 1 through 5, wherein the gate electrode material 118/122 preferably comprises a dimension $d_3$ sufficiently thin enough to facilitate the silicidation process, and wherein the hard mask 110/112/114 is preferably thicker than the gate electrode material 118/122. Advantageously, synergistic effects of combining the various embodiments of the invention described herein may be achieved, optimizing the homogeneity of the silicide or germanide formation proximate the fins 108, particularly when the gate electrode material 122 is fully silicided or germanided, for example. The work function and threshold voltage may be tuned by the phase control of the silicide or germanide 122 formation, achieving a homogeneous mid-gap work function along the height of the fins 108 proximate the channel region, according to embodiments of the present invention.

Alternatively, the embodiments described herein may be implemented alone in a semiconductor device 100, e.g., wherein the gate electrode material 118/122 preferably comprises a dimension sufficiently thin enough to facilitate the silicidation process, yet wherein the hard mask 110/112/114 is not thicker than the gate electrode material 118/122, and wherein the buried insulating material 106 is not recessed Likewise, the recess in the buried insulating material 106 may be greater than the thickness of the gate electrode material 118/122, yet the hard mask 110/112/114 may not be thicker than the gate electrode material 118/122, as another example. Other combinations of the various embodiments of the present invention described herein may also be used, for example.

In some embodiments, the silicided or germanided gate electrode material 122 is preferably fully silicided or germanided. However, in other embodiments, the silicided or germanided gate electrode material 122 may be silicided or germanided only in a top region, e.g., in an outer region of the gate electrode material 122, leaving the lower or inner regions of the gate electrode material 118 unsilicided or ungermanided.

Because silicide or germanide phase inhomogeneities of the gate electrode material 122 proximate the fin 108 are reduced (or eliminated, if all embodiments of the present invention described herein are combined) using embodiments of the invention described herein, advantageously, the threshold voltage of the FinFET device 130 is substantially the same across an entire surface of the first gate electrode and the second gate electrode 122, for example. Any silicide or germanide phase inhomogeneities, e.g., metal-rich or metal-poor phases are not formed close to the fins 108, and thus have no impact on the device 130 effective work function or threshold voltage, advantageously.

The threshold voltage may be tuned by forming a selected, desired phase of silicide or germanide, and/or the threshold voltage may be further tuned by the selection of the gate dielectric material and/or by the doping of the gate electrode material 122. For example, if the gate electrode material 122 comprises nickel silicide, a gate dielectric material 116 comprising $SiO_2$, HfSiO, or HfSiON may be used in conjunction with a selected phase of the $Ni_xSi_y$ to achieve a particular work function.

In some embodiments, e.g., if the silicide of the gate electrode material 122 comprises $Ni_xSi_y$, the target nickel phase of the silicide formed is preferably about 60 to 50%, for example. Alternatively, other targeted metal phases of the silicide or germanide may also be used.

In some embodiments and applications, an $NiSi_2$ phase is preferably avoided, for example. The $NiSi_2$ phase of nickel silicide has a much greater resistance than the NiSi phase, e.g., three times the resistance, as an example, and thus is less conductive than NiSi. In other embodiments and applications, an $Ni_2Si$ phase is preferably avoided, due to the work function of this phase of silicide, which is around 4.8, which may be unsuitable in certain applications. Likewise, other phases of silicide or germanide may be preferred or less preferred in certain applications, depending on the resistance, work function, and other parameters, as examples.

Some examples of work functions for multiple gate FETs that may be achieved in accordance with embodiments of the present invention are shown in Table 1, as examples. Alternatively, other types of silicides or germanides and doping configurations may also be used.

TABLE 1

| Transistor type | Silicide and phase | Doping | Work function |
|---|---|---|---|
| Low standby power n channel FinFET | NiSi or $Ni_3Si_2$ | Undoped | 4.65 eV |
| High performance n channel FinFET | NiSi or $Ni_3Si_2$ | P doped | 4.45 eV |
| Low standby power p channel FinFET | NiSi or $Ni_3Si_2$ | Undoped | 4.65 eV |
| High performance p channel FinFET | NiSi or $Ni_3Si_2$ | B doped | 4.85 eV |

The work function for devices formed on a gate dielectric material comprising $SiO_2$ having an NiSi or $Ni_3Si_2$ phase are higher for B doped gate electrode material (e.g., about 4.8 eV), whereas the same materials doped with P achieve a work function of about 4.5, for example. Undoped, these materials have a work function of about 4.6 to 4.7, for example. The work function for devices formed on a gate dielectric material comprising $SiO_2$ and having an $Ni_2Si$ phase doped with P comprise a work function of about 4.7 eV, and doped with B comprise a work function of about 4.6 eV, for example. Thus, the work function may be tuned by adjusting the doping, silicide or germanide phase, and gate dielectric material, in accordance with embodiments of the present invention, to achieve a desired threshold voltage for a FinFET device.

Advantageously, embodiments of the present invention provide methods of forming easily tunable mid-gap work function silicide or germanide gate electrodes, which may be used in low standby power, high performance, or other applications. Embodiments of the present invention may be implemented in logic devices, memory devices, peripheral circuitry devices, or other applications, as examples.

Figure 7:
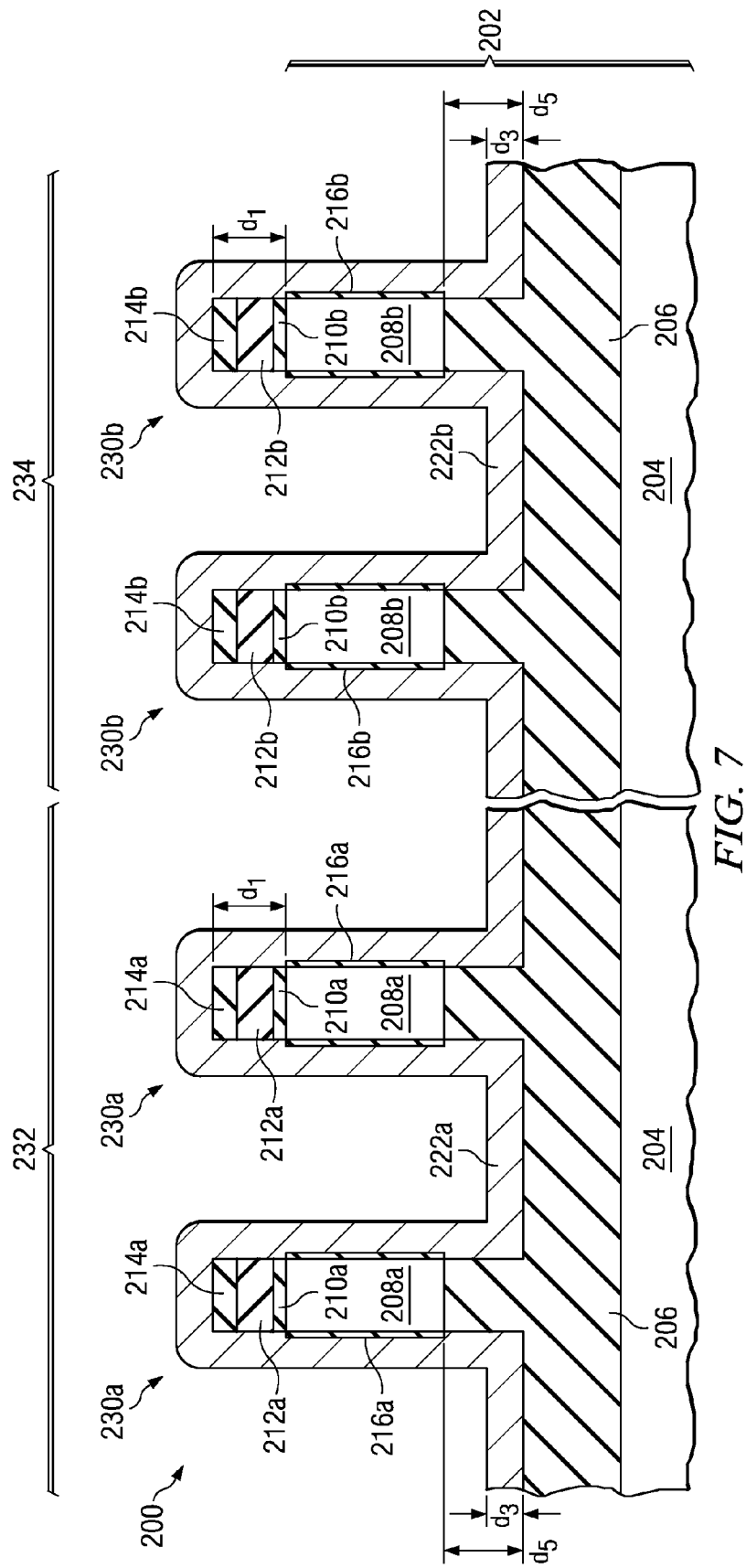
FIG. 7 shows a cross-sectional view of a CMOS device comprising a plurality of PMOS transistors and NMOS transistors formed from FinFET devices manufactured in accordance with an embodiment of the present invention.

FIG. 7 shows a cross-sectional view of a CMOS device 200 comprising a plurality of PMOS transistors 230a and NMOS transistors 230b formed from FinFET devices manufactured in accordance with an embodiment of the present invention. Again, like numerals are used for the various elements that were described in FIGS. 1 through 6. To avoid repetition, each reference number shown in FIG. 7 is not described again in detail herein. Rather, similar materials x02, x04, x06, x08, etc. . . . are preferably used for the various material layers shown as were described for FIGS. 1 through 6, where x=1 in FIGS. 1 through 6 and x=2 in FIG. 7. As an example, the preferred and alternative materials and dimensions described for the silicided or germanided gate electrode materials 122 in the description for FIGS. 1 through 6 are preferably also used for the silicided or germanided gate electrode materials 222a and 222b of FIG. 7.

The semiconductor device 200 includes at least one first region 232 wherein PMOS FinFETs 230a will be formed, and at least one second region 234 wherein NMOS FinFETs 230b will be formed, as shown. Only one first region 232 and one second region 234 are shown in the figures; however, there may be many first regions 232 and second regions 234 formed on a semiconductor device 200, for example. The first region 232 and the second region 234 may be separated by isolation regions (not shown in FIG. 7; see FIG. 9 at 352, for example).

The first region 232 may be masked while the second region 234 is processed. Likewise, the second region 234 may be masked while the first region 232 is processed. The silicided or germanided gate electrode materials 222a and 222b may be silicided or germanided simultaneously, and the work function and threshold voltages may be tuned using other parameters, such as doping levels and/or selection of the gate dielectric materials 216a and 216b, for example. Alternatively, the silicided or germanided gate electrode material 222a and 222b may be silicided or germanided separately while the second region 234 or first region 232 are masked, and the silicide or germanide phase of the silicided or germanided gate electrode materials 222a and 222b may be used as a parameter to tune the work function and threshold voltages of the FinFETs 230a and 230b, as another example. Note that in the embodiment shown in FIG. 7, the gate dielectric material 216a and 216b may be formed by oxidizing the sidewalls of the fins 208a and 208b, so that the gate dielectric materials 216a and 216b are not formed on other exposed surfaces. Alternatively, the gate dielectric materials 216a and 216b may be formed on all exposed surfaces, as shown in FIGS. 1 through 6.

Advantageously, each of the FinFET devices 230a and 230b comprise a first gate electrode and a second gate electrode comprising gate electrode materials 222a and 222b, respectively, that comprise a substantially homogeneous phase of the silicide or germanide over the entire height of the fin, due to the thinness of the gate electrode materials 222a and 222b, the thicker hard masks 210a/212a/214a and 210b/212b/214b, recessed buried insulating material 206, and/or the fully silicided or germanided gate electrode materials 222a and 222b, in accordance with embodiments of the present invention. The phase of the silicide or germanide of the gate electrode materials 222a and 222b may be the same phase or may comprise different phases, for example.

In some embodiments, the work function of the p channel transistors 230a in the first region 232 preferably comprises about 4.6 to 4.9 eV, and the work function of the n channel transistors 230b in the second region 234 preferably comprises about 4.4 to 4.7 eV. The work function of the transistors 230a and 230b are preferably different in some embodiments, for example.

The transistors 230a and 230b in the first and second regions 232 and 234 preferably comprise symmetric threshold voltages $V_t$ in accordance with some embodiments of the present invention, for example. The transistors 230a and 230b preferably have substantially symmetric threshold voltages of about +0.3 and −0.3 V, respectively, as examples, in one embodiment, although the threshold voltages may alternatively comprise other voltage levels, such symmetric $V_t$ values of about +/−0.1 V to about 15 V, as examples.

FIG. 8 shows a cross-sectional view of a FinFET device 330a in accordance with an embodiment of the present invention after the formation of upper metallization and insulating layers over the FinFET device 330a. FIG. 9 shows a fin structure of the FinFET device 330a shown in FIG. 8 in a view perpendicular to the view shown in FIG. 8. The FinFET gate electrode material 322a preferably is formed using the novel embodiments described herein, for example. Portions of the fin structures 308a comprise channel regions $308a_1$, and other portions of the fin structures 308a may be implanted with dopants to form source region $308a_2$ and drain region $308a_3$, as shown in FIG. 9. A view of the channel $308a_1$ disposed between the source region $308a_2$ and the drain region $308a_3$ can also be seen in the view shown in FIG. 9, for example. The implantation steps to form the source and drain regions $308a_2$ and $308a_3$ may alternatively take place before the manufacturing process steps described herein, in some embodiments, for example. Spacers 354 comprising an insulating material such as an oxide, nitride, or combinations thereof, may be formed over the sidewalls of the gate electrodes 322a and hard mask 310a/312a/314a, also shown in FIG. 9. Insulating and conductive layers may be formed over the CMOS FinFET or tri-gate transistors, such as insulating layers 344 and 350 and conductive layers 346a/346b/346c and 348a/348b/348c. The gate dielectric material 310a is shown disposed beneath the sidewall spacers 354, which is optional; alternatively, the gate dielectric material 310a may not be disposed beneath the sidewall spacers 354 in some embodiments, for example.

Contact 346a (FIG. 8) provides electrical contact to the gate of the multiple gate device, e.g., making contact with the gate electrode material 322a Likewise, contact 346b (FIG. 9) provides electrical contact to the source $308a_2$ via silicide or germanide 342 formed over the source $308a_2$, and contact 346c provides electrical contact to the drain $308a_3$ via silicide or germanide 342 formed over the drain $308a_3$.

Additional metallization and insulating layers may be formed and patterned over the top surface of the insulating material and contacts, such as conductive lines 348a, 348b, and 348c that make electrical contact to the contacts 346a, 346b, and 346c. Bond pads (not shown) may be formed over contacts, and a plurality of the semiconductor devices 300 may then be singulated or separated into individual die. The bond pads may be connected to leads of an integrated circuit package (also not shown) or other die, for example, in order to provide electrical contact to the multiple gate transistors 330a of the semiconductor device 300.

Embodiments of the present invention achieve technical advantages in several different multiple gate transistor device applications. For example, embodiments of the invention may be implemented in NMOS high performance (HP) devices, NMOS low operation power (LOP) devices, NMOS low standby power (LSTP) devices, PMOS high performance devices, PMOS low operation power devices, and PMOS low standby power devices, as examples.

Although embodiments of the present invention are described herein being formed on semiconductor-on-insulator substrates, embodiments of the present invention may also be formed on bulk substrates, for example.

Novel semiconductor devices comprising CMOS multiple gate devices having PMOS and NMOS devices are formed in accordance with embodiments of the present invention. Advantages of preferred embodiments of the present invention include providing methods of fabricating semiconductor devices 100, 200, and 300 and structures thereof. The multiple gate PMOS and NMOS transistors of CMOS devices preferably have a substantially symmetric $V_t$ that is tunable by adjusting the work function of the transistors using the novel embodiments of the present invention described herein. Several means of tuning the work function of transistors are described herein, by selection and control of the silicide or germanide phase, doping levels, and/or the selection of the gate dielectric materials, as examples.

Embodiments of the present invention advantageously provide novel methods and structures for manufacturing parasitic bi-modal free $V_t$ behavior FinFET devices 130, 230a, 230b, and 330a that avoid or reduce three-dimensional silicide or germanide phase inhomogeneities of the gate electrode materials 122, 222a, 222b, and 322a. A thicker hard mask 110/112/114, 210a/212a/214a, 210b/212b/214b, and 310a/312a/314a shifts any silicide or germanide phase inhomogeneities in the upper corners 126 upwards, and a recessed buried insulating material 106, 206, 306 shifts any silicide or germanide phase inhomogeneities in the lower corners 128 downwards.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A CMOS device comprising:
   a PMOS FinFET comprising
     a first semiconductive fin having first sidewalls and a first top surface;
     a first hard mask disposed on the first top surface of the first semiconductive fin;
     a first gate dielectric disposed on the first sidewalls and on the first hard mask; and
     a first gate electrode disposed over the first gate dielectric, wherein the first gate electrode comprises a substantially homogeneous first phase of a first silicide or germanide; and
   a NMOS FinFET comprising
     a second semiconductive fin having second sidewalls and a second top surface;
     a second hard mask disposed on the second top surface of the second semiconductive fin;
     a second gate dielectric disposed on the second sidewalls and on the second hard mask; and
     a second gate electrode disposed over the second gate dielectric, wherein the second gate electrode comprises a substantially homogeneous second phase of a second silicide or germanide, and
   wherein the first gate electrode and the second gate electrode comprise the same thickness.

2. The CMOS device according to claim 1, wherein the first phase is different than the second phase.

3. The CMOS device according to claim 1, wherein the PMOS FinFET and the NMOS FinFET comprise undoped NiSi or $Ni_3Si_2$.

4. The CMOS device according to claim 1, wherein the PMOS FinFET and the NMOS FinFET comprise doped NiSi or $Ni_3Si_2$.

5. The CMOS device according to claim 4, wherein the PMOS FinFET comprises a work function of about 4.6 to 4.9 eV, and wherein the NMOS FinFET comprises a work function of about 4.4 to 4.7 eV.

6. The CMOS device according to claim 1, further comprising a plurality of the PMOS FinFETs and a plurality of the NMOS FinFETs.

7. The CMOS device according to claim 1, wherein the first phase is the same as the second phase.

8. A transistor comprising:
   a semiconductive fin having sidewalls and a top surface, the semiconductive fin comprising first and second channel regions each having a length;
   a gate dielectric disposed on the sidewalls of the semiconductive fin; and
   a gate electrode disposed over the gate dielectric, wherein the gate electrode comprises a substantially homogeneous undoped Ni$_3$Si$_2$ or Ni$_3$Si$_2$ doped with P or B disposed over the lengths of the channel regions of the semiconductive fin,
wherein the semiconductive fin is disposed over a buried insulating layer, the buried insulating layer comprising a recess below a bottom surface of the semiconductive fin proximate the semiconductive fin.

9. The transistor according to claim 8, further comprising an isolation layer disposed directly on the top surface of the semiconductive fin, the isolation layer comprising silicon oxide and silicon nitride.

10. The transistor according to claim 9, wherein the isolation layer comprises three layers, wherein a first layer comprise a first oxide, wherein a second layer comprises a nitride, and wherein a third layer comprises second oxide.

11. The transistor according to claim 9, wherein the isolation layer comprise a greater thickness than the gate electrode.

12. The transistor according to claim 8, wherein the recess in the buried insulating layer comprises a greater thickness than the gate electrode.

13. The transistor according to claim 8, wherein the gate electrode is a FUSI.

14. The transistor according to claim 8, wherein the semiconductive fin comprises silicon or a compound semiconductor such as GaAs, InP, Si/Ge or SiC.

15. The transistor according to claim 8, further comprising a hard mask disposed between the top surface of the semiconductive fin and the gate dielectric, and wherein a thickness of the gate electrode is thinner than a thickness of the hard mask.

16. A CMOS device comprising:
a PMOS FinFET comprising
a first fin comprising a first insulation region and a first semiconductive channel region disposed on the first insulation region, the first insulation region comprising a first height, wherein the first fin comprises first sidewalls and a first top surface;
a first insulation layer disposed over the first top surface of the first fin;
a first gate dielectric disposed over the first insulation layer and the first sidewalls;
a first gate electrode disposed over the first gate dielectric; and
a NMOS FinFET comprising
a second fin comprising a second insulation region and a second semiconductive channel region disposed on the second insulation region, the second insulation region comprising the first height, wherein the second fin comprises second sidewalls and a second top surface;
a second insulation layer disposed over the second top surface of the second fin;
a second gate dielectric disposed over the second insulation layer and the second sidewalls; and
a second gate electrode disposed over the second gate dielectric,
wherein the first and second gate electrodes comprise a second height, wherein the second height is less than the first height, and
wherein the first and second gate electrode comprises a silicide or germanide.

17. The CMOS device according to claim 16, wherein the silicide or germanide comprises undoped NiSi or Ni$_3$Si$_2$, or NiSi or Ni$_3$Si$_2$ doped with P or B.

18. The CMOS device according to claim 16, wherein the first and second gate dielectrics comprise HfO$_2$, HfSiO$_x$, Al$_2$O$_3$, ZrO$_2$, ZrSiO$_x$, Ta$_2$O$_5$, La$_2$O$_3$, HfAlO$_x$, ZrAlO$_x$, SiAlO$_x$, HfSiAlO$_x$, ZrSiAlO$_x$, Y$_2$O$_3$, TiO$_2$, nitrides thereof, Si$_x$N$_y$, SiON, SiO$_2$, or multiple layers or combinations thereof.

19. The CMOS device according to claim 16, wherein the first and second insulation layers are a trilayer comprising oxide, nitride and oxide.

20. A transistor comprising:
a semiconductive fin having sidewalls and a top surface, the semiconductive fin comprising first and second channel regions each having a length;
a gate dielectric disposed on the sidewalls of the semiconductive fin;
a gate electrode disposed over the gate dielectric, wherein the gate electrode comprises a substantially homogeneous undoped Ni$_3$Si$_2$ or Ni$_3$Si$_2$ doped with P or B disposed over the lengths of the channel regions of the semiconductive fin; and
an isolation layer disposed directly on the top surface of the semiconductive fin, wherein the isolation layer comprises three layers, wherein a first layer comprise a first oxide, wherein a second layer comprises a nitride, and wherein a third layer comprises second oxide.

21. A transistor comprising:
a semiconductive fin having sidewalls and a top surface, the semiconductive fin comprising first and second channel regions each having a length;
a gate dielectric disposed on the sidewalls of the semiconductive fin;
a gate electrode disposed over the gate dielectric, wherein the gate electrode comprises a substantially homogeneous undoped Ni$_3$Si$_2$ or Ni$_3$Si$_2$ doped with P or B disposed over the lengths of the channel regions of the semiconductive fin; and
an isolation layer disposed directly on the top surface of the semiconductive fin, wherein the isolation layer comprise a greater thickness than the gate electrode.

22. The transistor according to claim 21, wherein the isolation layer comprises silicon oxide and silicon nitride.

* * * * *

UNITED STATES PATENT AND TRADEMARK OFFICE
CERTIFICATE OF CORRECTION

PATENT NO. : 8,507,347 B2  
APPLICATION NO. : 13/355610  
DATED : August 13, 2013  
INVENTOR(S) : Schulz Page 1 of 1

It is certified that error appears in the above-identified patent and that said Letters Patent is hereby corrected as shown below:

In the Claims:

In Col. 14, line 51, claim 5, delete "claim 4" and insert --claim 1--.

Signed and Sealed this  
Nineteenth Day of November, 2013

Teresa Stanek Rea  
*Deputy Director of the United States Patent and Trademark Office*